United States Patent
Gasquet

(10) Patent No.: US 7,583,542 B2
(45) Date of Patent: Sep. 1, 2009

(54) MEMORY WITH CHARGE STORAGE LOCATIONS

(75) Inventor: Horacio P. Gasquet, Austin, TX (US)

(73) Assignee: Freescale Semiconductor Inc., Austin, TX (US)

( * ) Notice: Subject to any disclaimer, the term of this patent is extended or adjusted under 35 U.S.C. 154(b) by 101 days.

(21) Appl. No.: 11/277,694

(22) Filed: Mar. 28, 2006

(65) Prior Publication Data

US 2007/0242534 A1  Oct. 18, 2007

(51) Int. Cl.
G11C 7/00 (2006.01)
(52) U.S. Cl. .............................. 365/189.09; 365/185.17; 365/185.18
(58) Field of Classification Search ............ 365/189.09, 365/185.17, 185.18
See application file for complete search history.

(56) References Cited

U.S. PATENT DOCUMENTS

| | | | |
|---|---|---|---|
| 5,923,585 A * | 7/1999 | Wong et al. | 365/185.03 |
| 5,973,962 A * | 10/1999 | Kwon | 365/185.18 |
| 6,345,000 B1 * | 2/2002 | Wong et al. | 365/185.29 |
| 6,570,787 B1 * | 5/2003 | Wang et al. | 365/185.17 |
| 6,657,252 B2 | 12/2003 | Fried et al. | |
| 6,768,158 B2 | 7/2004 | Lee et al. | |
| 6,831,310 B1 | 12/2004 | Mathew et al. | |
| 6,958,265 B2 | 10/2005 | Steimle et al. | |
| 6,958,512 B1 * | 10/2005 | Wu et al. | 257/315 |
| 7,085,160 B2 * | 8/2006 | Shiga et al. | 365/185.17 |
| 2004/0251487 A1 | 12/2004 | Wu et al. | |
| 2005/0037574 A1 | 2/2005 | Sugiyama | |
| 2005/0057964 A1 | 3/2005 | Mathew et al. | |
| 2005/0139893 A1 | 6/2005 | Hofmann et al. | |
| 2006/0152977 A1 * | 7/2006 | Joo | 365/185.17 |
| 2006/0181925 A1 * | 8/2006 | Specht et al. | 365/185.17 |
| 2007/0025152 A1 * | 2/2007 | Futatsuyama | 365/185.17 |
| 2008/0084750 A1 * | 4/2008 | Hosono | 365/185.18 |

FOREIGN PATENT DOCUMENTS

| | | |
|---|---|---|
| DE | 03096424 A1 | 11/2003 |
| EP | 2004023519 A2 | 3/2004 |
| US | 03069664 A1 | 8/2003 |

OTHER PUBLICATIONS

Muralidhar, et al., U.S. Appl. No. 11/072,878, filed Mar. 4, 2005, Vertical Transistor NVM with Body Contact Structure and Method.
Rao, Rajesh A., et al., U.S. Appl. No. 10/876,820, filed Jun. 25, 2004, Method of Forming a Nanocluster Charge Storage Device.
Steimle, Robert F., U.S. Appl. No. 10/876,805, filed Jun. 25, 2004, Method of Forming a Nanocluster Charge Storage Device.

* cited by examiner

*Primary Examiner*—Connie C Yoha
(74) *Attorney, Agent, or Firm*—Kim-Marie Vo

(57) ABSTRACT

A method for operating a memory device includes selecting a cell comprising an array of word lines, selecting a word line within said array and applying an operating voltage to said selected word line. A shielding voltage is also applied to the closest adjacent facing word line of said selected word line. This may prevent unintended, program, read, or erase of said unselected word line. The remainder of unselected word lines can be floated.

15 Claims, 10 Drawing Sheets

CONDITIONS FOR BIT 1711

| OPERATION | $BL_1$ | $BL_2$ | $B_0+B_3$ | $WL_0$ | $WL_1$ | $WL_2$ | $WL_3$ | $WL_4$ | WELL |
|---|---|---|---|---|---|---|---|---|---|
| PROGRAM | GND | $VD_1$ | FLOAT OR $VB_2$ | GND (FLOAT IF $WL_1$=GND) | FLOAT, $VG_2$, OR GND | $VG_1$ | $VB_1$ | FLOAT | $VB_1$ |
| BULK ERASE | FLOAT OR $VB_2$ | FLOAT OR $VB_2$ | FLOAT OR $VB_2$ | $VG_3$ | $VG_3$ | $VG_3$ | $VG_3$ | $VG_3$ | $VB_2$ |
| ROW ERASE | FLOAT OR $VB_2$ | FLOAT OR $VB_2$ | FLOAT OR $VB_2$ | FLOAT | FLOAT | $VG_3$ | $VB_2$ | FLOAT | $VB_2$ |
| READ | GND | $VD_2$ | FLOAT OR $VB_2$ | GND (FLOAT IF $WL_1$=GND) | $VG_5$, GND, OR $VB_1$ | $VG_4$ | $VB$ | FLOAT | $VB_1$ |

FIG. 19

CONDITIONS FOR BIT 1713

| OPERATION | $BL_1$ | $BL_2$ | OTHER UNSELECTED BL | $WL_0$ | $WL_1$ | $WL_2$ | $WL_3$ | $WL_4$ | WELL |
|---|---|---|---|---|---|---|---|---|---|
| PROGRAM | $VD_1$ | GND | FLOAT OR $VB_1$ | $VB_1$ | $VG_1$ | FLOAT, $VG_2$, OR GND | GND (FLOAT IF $WL_2$=GND) | FLOAT | $VB_1$ |
| BULK ERASE | FLOAT OR $VB_2$ | FLOAT OR $VB_2$ | FLOAT OR $VB_2$ | $VG_3$ | $VG_3$ | $VG_3$ | $VG_3$ | $VG_3$ | $VB_2$ |
| ROW ERASE | FLOAT OR $VB_2$ | FLOAT OR $VB_2$ | FLOAT OR $VB_2$ | $VB_2$ | $VB_2$ | FLOAT | FLOAT | FLOAT | $VB_2$ |
| READ | $VD_2$ | GND | FLOAT OR $VB_1$ | $VB_1$ | $VG_4$ | $VG_5$, GND, OR $VB_1$ | GND (FLOAT IF $WL_2$=GND) | FLOAT | $VB_1$ |

FIG. 20

MEMORY WITH CHARGE STORAGE LOCATIONS

BACKGROUND OF THE INVENTION

1. Field of the Invention

This invention relates in general to a memory and specifically to a memory with charge storage locations.

2. Description of the Related Art

When operating a memory device, a voltage is applied to a selected word line coupled to the gate electrode, while all other word lines are either grounded or floating. As memory devices within an array are formed closer together to decrease die size, the word line that is adjacent the selected word line may undesirably become capacitively coupled to the selected word line. Although an insulating material lies between the two word lines, the distance between them may be small enough to enable coupling. This undesirable coupling can occur in any memory device, but especially occurs in non-planar transistors, such as FinFETs. If coupling occurs, the adjacent cell may be undesirably programmed, erased, or read. Therefore, a need exists for mitigating such coupling.

BRIEF DESCRIPTION OF THE DRAWINGS

The present invention may be better understood, and its numerous objects, features, and advantages made apparent to those skilled in the art by referencing the accompanying drawings.

FIG. 19 sets forth a table of a set of voltages applied to bitlines and word lines of a NOR flash memory array of NMOS transistors for programming, erasing, and reading a charge storage location of the memory array according to an embodiment of the present invention.

FIG. 20 sets forth a table of a set of voltages applied to bitlines and word lines of a NOR flash memory array of NMOS transistors for programming, erasing, and reading another charge storage location of the memory array according to an embodiment of the present invention.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
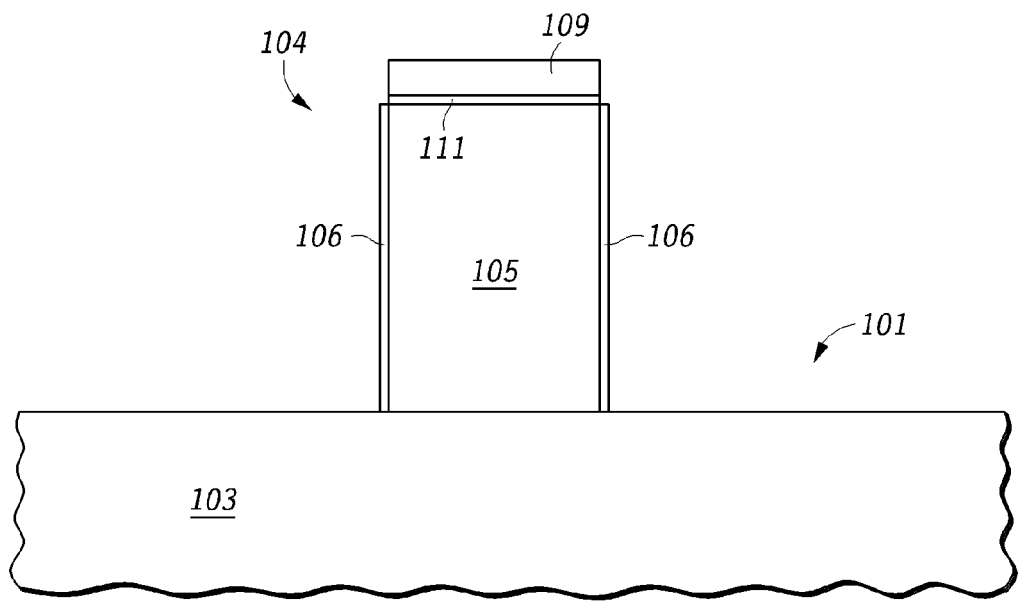
FIG. 1 is a partial cross sectional view of one embodiment of a semiconductor wafer during a stage in the manufacture of a semiconductor device according to an embodiment of the present invention.

FIG. 1 shows a partial cross sectional view of a semiconductor wafer during a stage in the manufacture of a semiconductor device with independent gate structures according to one embodiment of the present invention. Wafer 101 includes a substrate with an insulating layer 103. A structure 104 has been formed over insulating layer 103. Structure 104 includes a semiconductor structure portion 105 formed over insulating layer 103, a dielectric portion 111 (e.g. silicon dioxide) formed over semiconductor structure portion 105 and the insulating layer 103, and a nitride portion 109 located over the dielectric portion 111 and the semiconductor structure portion 105. In one embodiment, structure 104 is formed by depositing a layer of semiconductor material over the insulating layer 103, forming a dielectric layer over the semiconductor layer (e.g. by thermal oxidation of the semiconductor layer or by atomic layer deposition of a high K dielectric,) and then depositing a layer of nitride over the dielectric. The semiconductor layer, the dielectric layer, and the nitride layer are then patterned to form structure 104. Afterwards, a dielectric layer 106 is formed on the sidewalls of semiconductor structure portion 105. As will be shown later, a channel region and current terminal regions of a transistor are formed in semiconductor structure portion 105 of structure 104. In one embodiment, semiconductor structure portion 105 is made of epitaxial silicon bonded on insulating layer 103. In other embodiments, semiconductor structure portion 105 may be made of polysilicon or another semiconductor material. In one embodiment, structure 104 is a fin structure of a FinFET. In other embodiments, the nitride portion 109 may be made of other materials (e.g. other dielectrics) that can be utilized as a hard etch mask.

Figure 2:
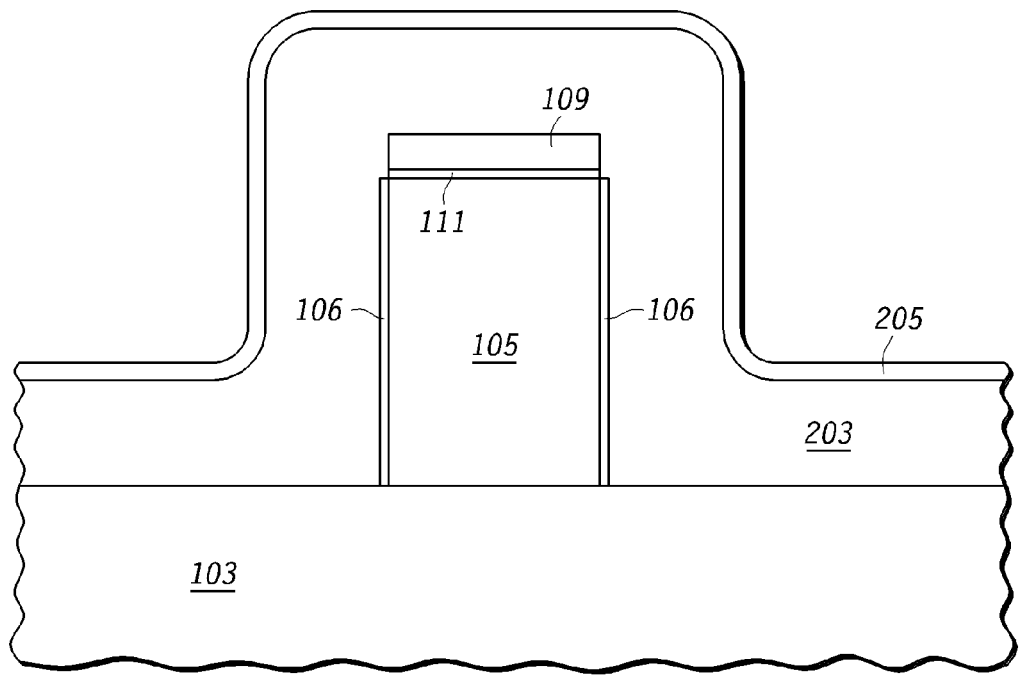
FIG. 2 is a partial cross sectional view of one embodiment of a semiconductor wafer during another stage in the manufacture of a semiconductor device according to an embodiment of the present invention.

Referring to FIG. 2, a conformal polysilicon layer 203 is deposited over wafer 101 including over structure 104. As will be shown later, the polysilicon layer 203 is utilized to form independent gate structures of a FinFET transistor. In other embodiments, the polysilicon layer 203 may be made of other gate materials such as tungsten, titanium, tantalum silicon nitride, silicides such as cobalt or nickel silicides, germanium, silicon germanium, other metals, the likes or combinations thereof. In the embodiment shown, a conformal nitride layer 205 is then deposited over the polysilicon layer 203. In one embodiment, the nitride layer 205 is used both as an antireflective coating (ARC) and as a hard mask for etching the polysilicon layer 203. The nitride layer 205 may not be included in some embodiments. In some embodiments, layer 203 may be doped prior to the deposition of the nitride layer 205. In these embodiments, the polysilicon layer 203 may be doped with single or multiple implants at various energies, angles, or the nitride species. For example, in one embodiment, the left side of the polysilicon layer 203, relative to the view shown in FIG. 2, may be doped with a first dopant at a first angle to provide the left side with a first conductivity type. And the right side of the polysilicon layer 203, relative to the view shown in FIG. 2 may be doped at a second angle relative to the view shown in FIG. 2 to provide the right side with a second conductivity type.

Figure 3:
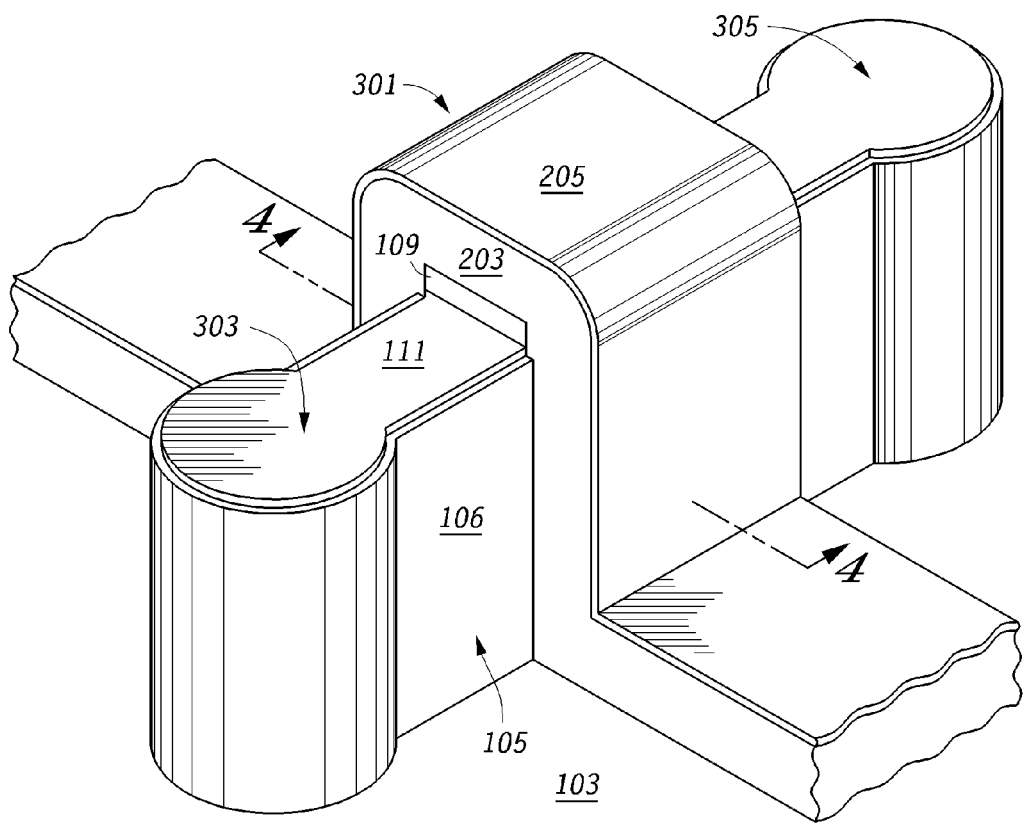
FIG. 3 is a partial isometric view of one embodiment of a semiconductor wafer during another stage in the manufacture of a semiconductor device according to an embodiment of the present invention.

FIG. 3 is a partial view of the wafer 101 after the layers 205 and 203 have been patterned to form a gate structure 301. In some embodiments, the layers 205 and 203 are patterned using conventional photolithographic techniques. During the patterning, the portion of the nitride portion 109 that is located over structure 104 but not located under gate structure 301 is removed. In other embodiments, the removed portion of nitride portion 109 may be removed at a later stage during manufacture than at the stage shown in FIG. 3.

At this stage of manufacturing, structure 104 now includes current terminal regions 303 and 305 located in each end of the semiconductor structure portion 105 of the structure 104. In one embodiment where the resultant transistor structure is a field effect transistor (FET), regions 303 and 305 serve as the source and drain regions, respectively. Regions 303 and 305 may be doped at this time by ion implantation plasma doping or the like.

Figure 4:
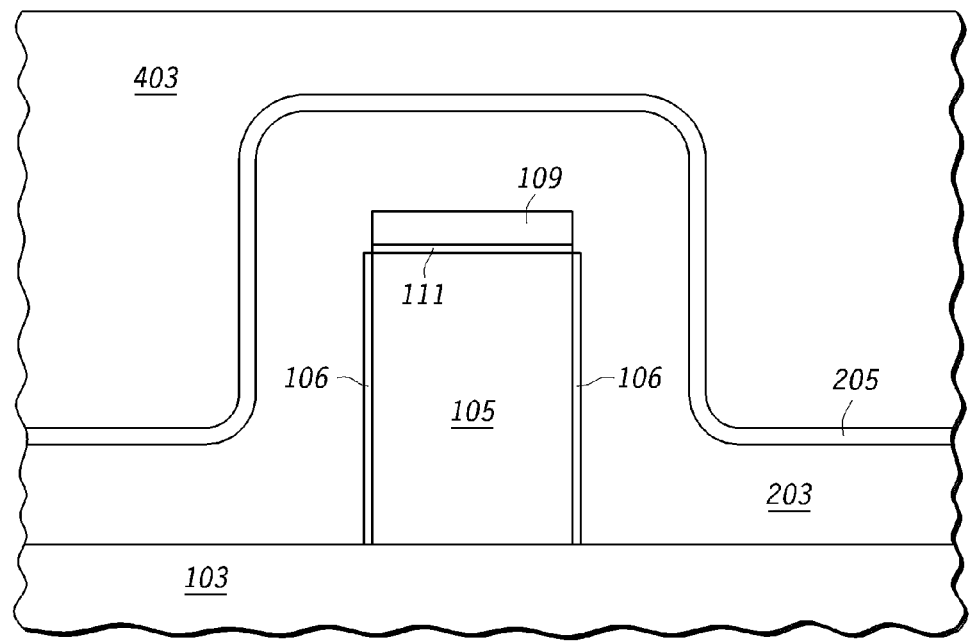
FIG. 4 is a partial cross sectional view of one embodiment of a semiconductor wafer during another stage in the manufacture of a semiconductor device according to an embodiment of the present invention.

FIG. 4 shows a partial cross sectional view of the wafer 101 after a deposition of a layer 403 over wafer 101. In one embodiment, the layer 403 is a planar layer. In some embodiments, the layer 403 may include photoresist, spin-on-glass, or an organic antireflective coating material. Layer 403 may be formed by spin on techniques or chemical vapor deposition (CVD) techniques followed by chemical mechanical polish or reflow.

Figure 5:
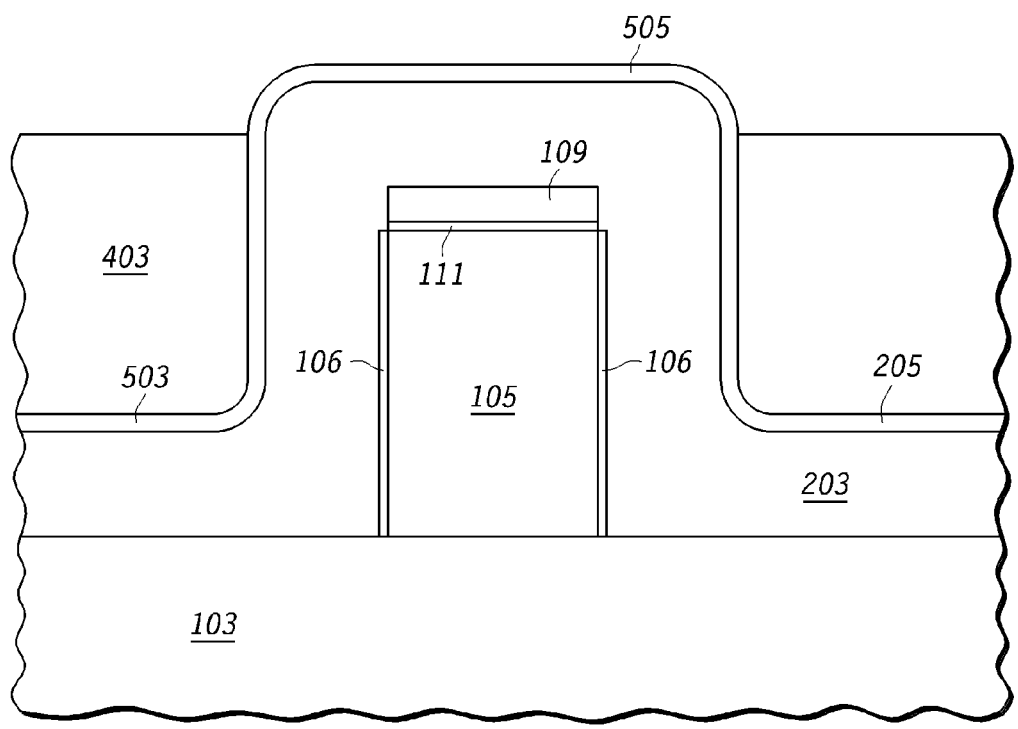
FIG. 5 is a partial cross sectional view of one embodiment of a semiconductor wafer during another stage in the manufacture of a semiconductor device according to an embodiment of the present invention.
Figure 6:
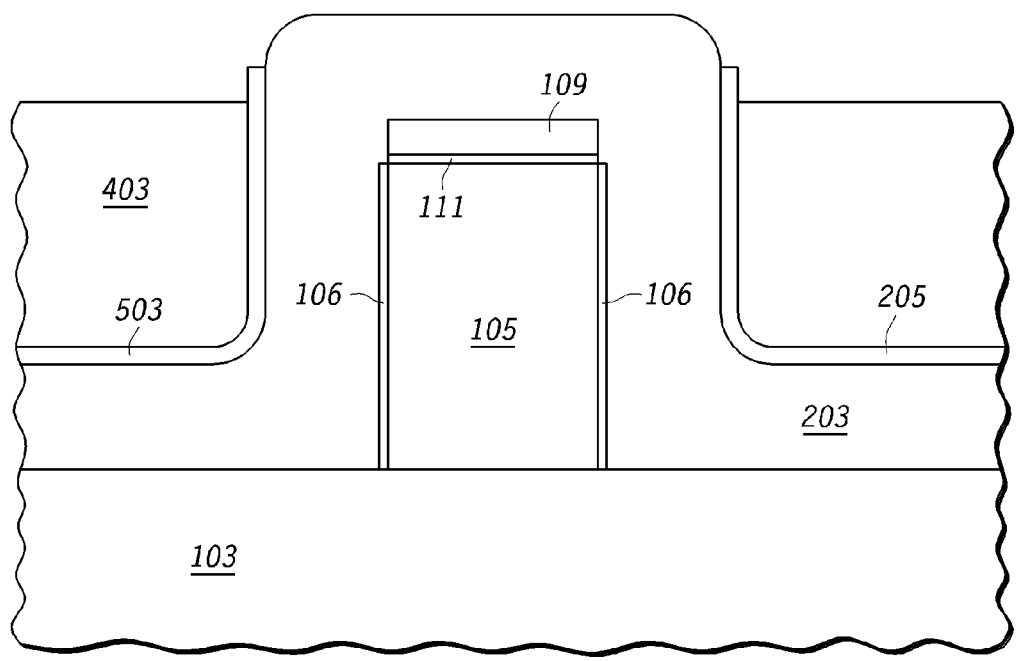
FIG. 6 is a partial cross sectional view of one embodiment of a semiconductor wafer during another stage in the manufacture of a semiconductor device according to an embodiment of the present invention.

FIG. 5 shows the wafer 101 after the layer 403 has been etched back to a level below the top 505 of the nitride layer 205. The top 505 is located over the structure 104 and is exposed when the layer 403 is etched back. In one embodiment, the layer 403 may be etched back by a conventional dry or wet etch techniques. In the embodiment shown, after the etch back, the layer 403 is at least thick enough to protect a portion 503 of the nitride layer 205 when the top 503 is subsequently removed, which in one embodiment occurs by etching, as shown in FIG. 6. In other embodiments, the resultant structure of layer 403 as shown in FIG. 5 may be formed by depositing the layer 403 to the level shown in FIG. 5, or another desired level.

FIG. 6 shows the wafer 101 in FIG. 5 after the top 505 of the nitride layer 205 is removed by etching. Any known chemistry can be used. Preferably the chemistry is selective to the layer 403.

Figure 7:
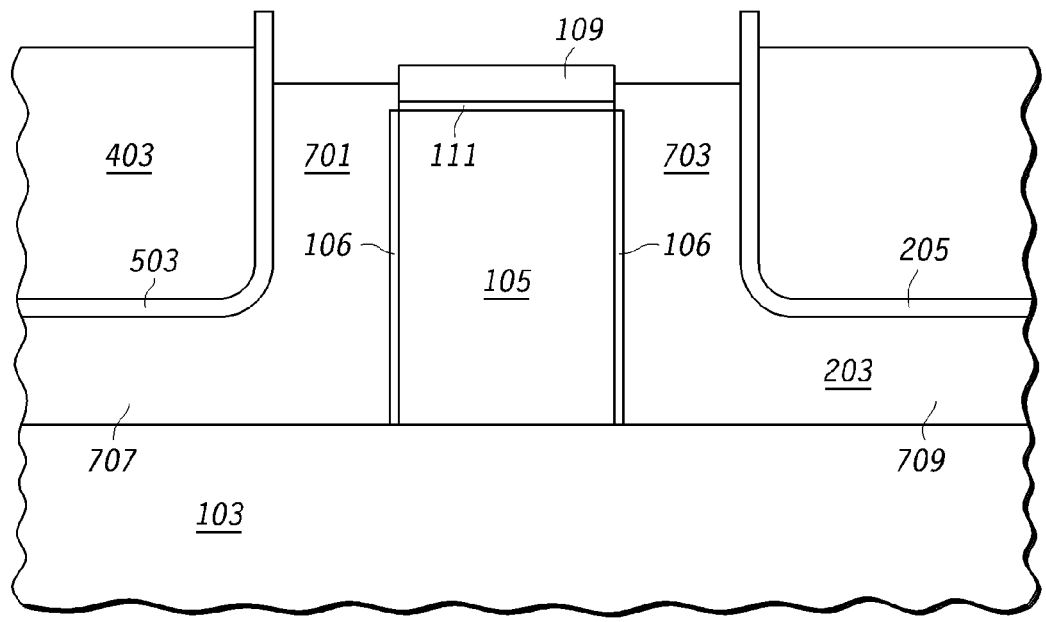
FIG. 7 is a partial cross sectional view of one embodiment of a semiconductor wafer during another stage in the manufacture of a semiconductor device according to an embodiment of the present invention.

Referring to FIG. 7, after the top 505 of the nitride layer 205 has been removed, the portion of layer 203 previously located under the top 505 of the nitride layer 205 is removed by a non abrasive etching (e.g. wet or dry) to form independent gate structures 701 and 703. Layer 403 (along with the remaining portions of layer 205) protects portions 707 and 709 of the layer 203 from being removed during the etching of the layer 203. Gate structures 701 and 703 each have a vertical portion located along a sidewall of structure 104.

Utilizing a planar layer (e.g., 403) for the formation of independent gate structures, as described above, may allow a portion of the gate material to be removed to form separate gate structures for a transistor without extra masking steps. In some embodiments, the planar layer allows for the portion of the gate structure located over structure 104 to be removed without removing the portions of the gate structure used to form the independent gate structures. In some embodiments, because portions of the conformal layers, including the gate material located over structure 104, are not protected by the planar layer, these portions can be removed, for example, by etching to isolate the gate structures without using an extra mask step. Accordingly, alignment problems in forming (separate) gates previously described may be avoided.

Figure 8:
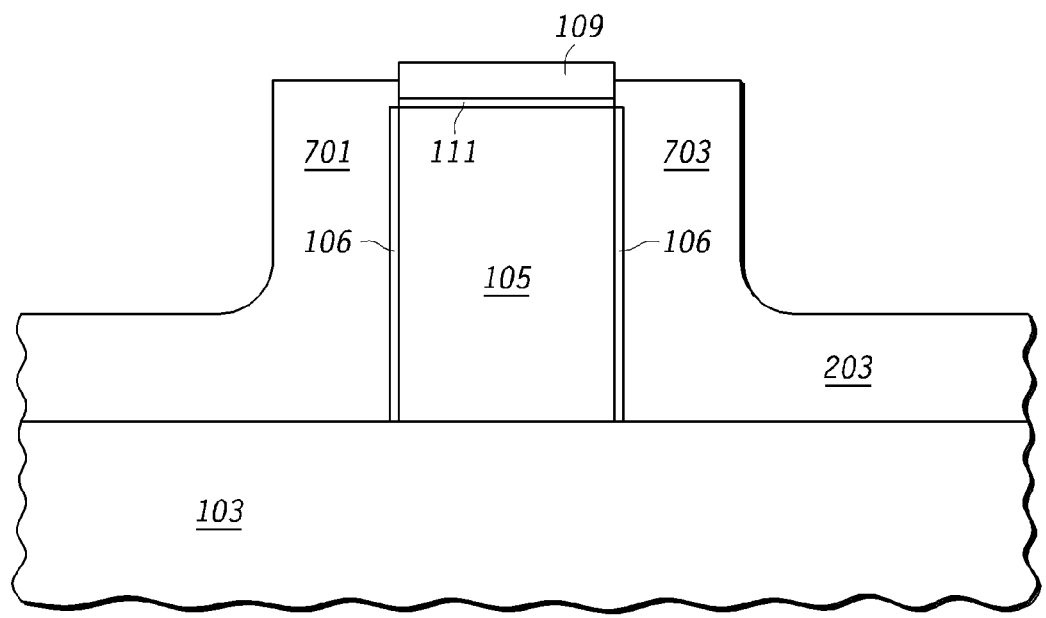
FIG. 8 is a partial cross sectional view of one embodiment of a semiconductor wafer during another stage in the manufacture of a semiconductor device according to an embodiment of the present invention.

FIG. 8 shows the wafer 101 of FIG. 7 after the removal of the remaining portions of the layers 403 and 205 in accordance with some embodiments. These layers may be removed by wet or dry etches. In other embodiments, the remaining portions of layers 403 and 205 are not removed.

Figure 9:
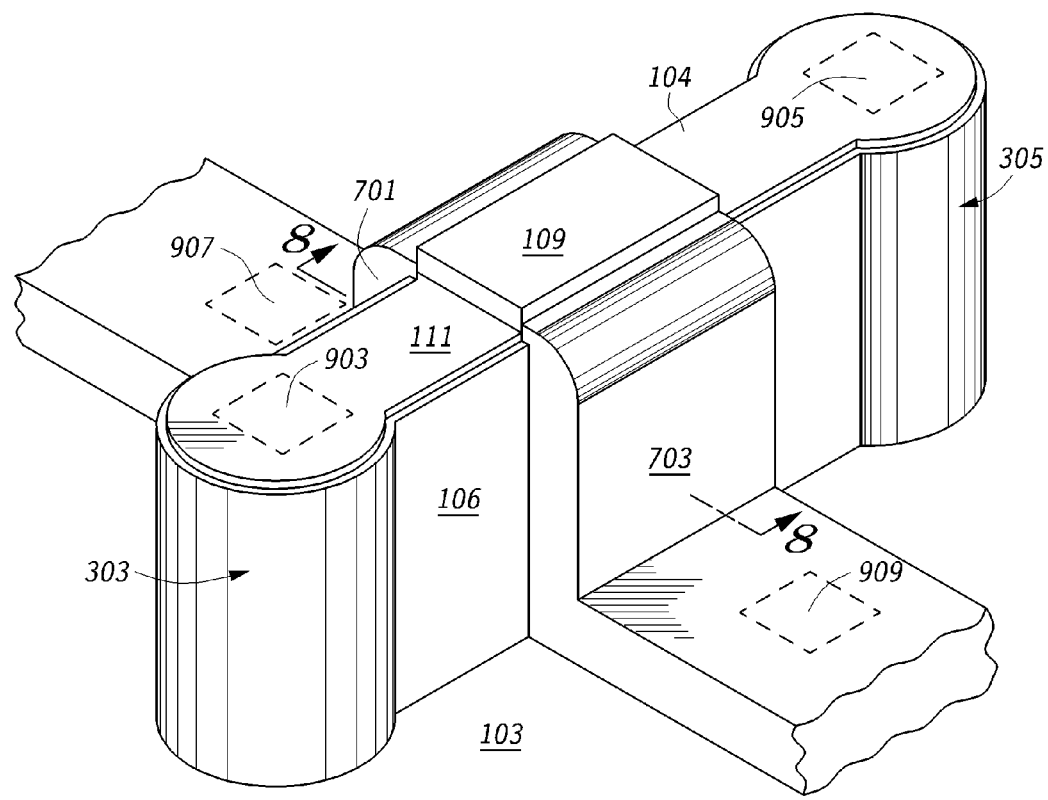
FIG. 9 is a partial isometric view of one embodiment of a semiconductor wafer during another stage in the manufacture of a semiconductor device according to an embodiment of the present invention.

FIG. 9 shows a different view of the semiconductor device shown in FIG. 8. In later processing stages, spacers and silicide layers (not shown) of the transistor are formed by conventional semiconductor techniques. Regions 903 and 905 serve as current terminal contacts (e.g. as source/drain contacts for FETs). Also, regions 907 and 909 serve as gate contacts for gate structures 701 and 703, respectively.

Figure 10:
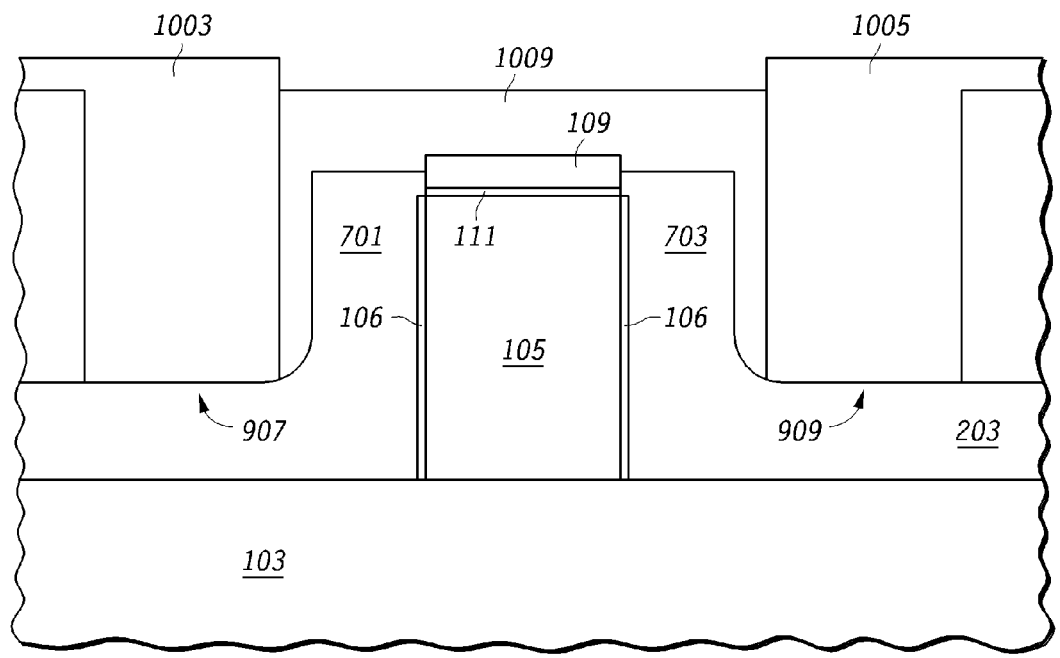
FIG. 10 is a partial cross sectional view of one embodiment of a semiconductor wafer during another stage in the manufacture of a semiconductor device according to an embodiment of the present invention.

FIG. 10 shows the same view as FIG. 8 after the formation of gate vias 1003 and 1005 over regions 907 and 909, respectively. A low K (dielectric constant) dielectric material 1009 is shown deposited over the resultant structure and adjacent the gate vias 1003 and 1005. Other conventional processing stages not shown or described may be performed on wafer 101 to form other conventional structures (such as interconnects and passivation layers) of a semiconductor device. Afterwards, the wafer 101 is singulated to separate the integrated circuits of the wafer.

Transistors with independent gate structures according to the present invention may be made by other processes. For example, the formation of the planar layer 403 and the removal of the portion of gate material (e.g. in layer 203) located over structure 104 may be performed after the formation of spacers or silicides. Also, transistors with independent gate structures may be made without utilizing a nitride layer 205. With these embodiments, the layer 403 would be formed such that the top portion of the layer of gate material (e.g. layer 203) located over the structure 104 would be exposed and capable of being etched.

In some embodiments, independent gate structures may be coupled together either by hardwiring (e.g. conductive material extending between the gate structures) or by other semiconductor devices (e.g., transistors) which would allow for the gate structures to be selectively coupled together.

FIGS. 11-17 set forth views of a semiconductor wafer during various stages in the manufacture of another embodiment of a transistor with independent gate structures according to the present invention. The semiconductor device formed also includes charge storage locations located between the gates and the channel region of the transistor. As will be describe later, such a semiconductor device may be utilized as a non volatile memory device for storing data in the charge storage locations.

Figure 11:
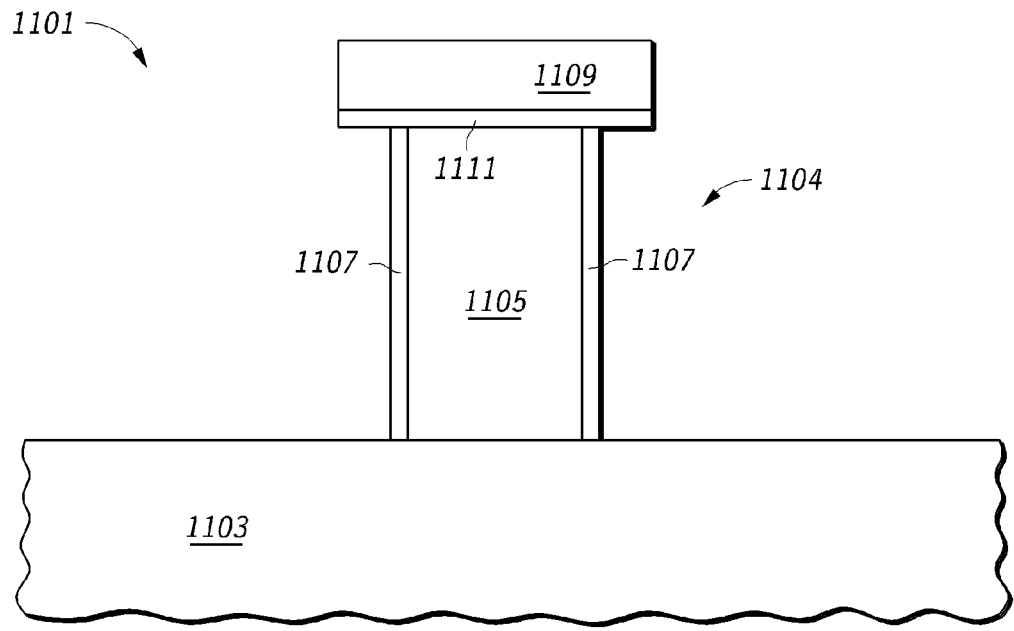
FIG. 11 is a partial cross sectional view of another embodiment of a semiconductor wafer during a stage in the manufacture of a semiconductor device according to an embodiment of the present invention.

Wafer 1101 includes a substrate having an insulating layer 1103. A structure 1104 has been formed over the insulating layer 1103. In one embodiment, the structure 1104 is a "fin" structure for a FinFET transistor having charge storage locations. The structure 1104 includes a semiconductor structure portion 1105 formed over the insulating layer 1103, a dielectric portion 1111 (e.g. silicon dioxide) formed over semiconductor structure portion 1105 and the insulating layer 1103, and a nitride portion 1109 located over the dielectric portion 1111 and the semiconductor structure portion 1105. In one embodiment, the structure 1104 is formed by depositing a layer of semiconductor material over the insulating layer 1103, forming a dielectric layer over the semiconductor material layer (e.g. by thermal oxidation of the semiconductor layer or by atomic layer deposition of a high K dielectric), and then depositing a layer of nitride over the dielectric. The semiconductor layer, the dielectric layer, and the nitride layer are then patterned to form a structure wherein the sidewalls of the semiconductor layer, the dielectric portion 1111, and nitride portion 1109 are flush with each other. In the embodiment shown, the remaining portion of the semiconductor layer is then trimmed (e.g. with a dry etch having an isotropic component) to recess the sidewalls of remaining semiconductor layer to form portion 1105 as shown in FIG. 11. In other embodiments, the semiconductor structure portion 1105 is not trimmed. In some embodiments, the semiconductor structure portion 1105 may be doped prior to the patterning of the layer of semiconductor material by conventional semiconductor processing techniques to provide the channel region with a specific conductivity type.

Afterwards, a dielectric layer 1107 is formed on the sidewalls of semiconductor structure portion 1105. As will be shown later, the channel region and current terminal regions are formed in the semiconductor structure portion 1105. In one embodiment, the semiconductor structure portion 1105 is made of epitaxial silicon bonded on the insulating layer 1103. In other embodiments, the semiconductor structure portion 1105 may be made of polysilicon or another semiconductor material. In one embodiment, the structure 1104 is a fin structure of a FinFET.

Figure 12:
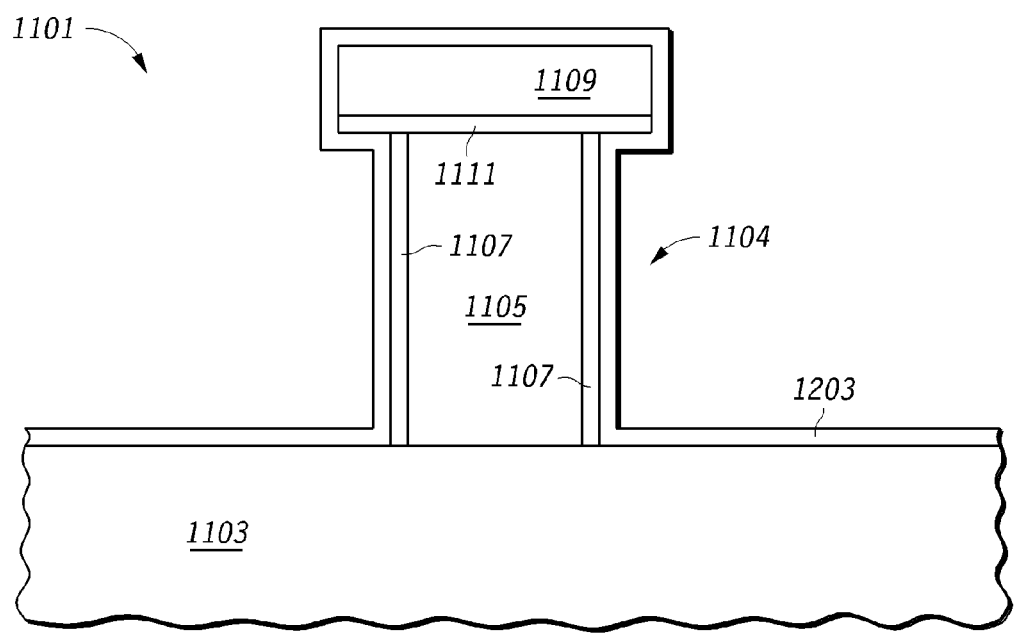
FIG. 12 is a partial cross sectional view of another embodiment of a semiconductor wafer during another stage in the manufacture of a semiconductor device according to an embodiment of the present invention.

Referring to FIG. 12, a layer 1203 of charge storage material is then deposited over the wafer 1101 including the structure 1104. In one embodiment, the layer 1203 includes a layer of conductive material such as polysilicon (e.g. as with a floating gate transistor). In other embodiments, the layer 1203 may include other types of charge storage material including material having a plurality of charge trapping elements (e.g. silicon nitride as with a thin film transistor). Still in other embodiments, the layer 1203 may include discrete charge storage material (e.g. silicon nanocrystals embedded in a layer of dielectric). In some embodiments, the nanocrystals are 2-10 nm in diameter and have a density of $3*10e^11/cm^2$. In other embodiments, the layer 1203 may be made of multiple layers such as, for example, a layer of silicon nanocrystals and a layer of silicon nitride deposited over the layer of silicon nanocrystals or a layer of silicon nanocrystals embedded between two layers of dielectric material.

Figure 13:
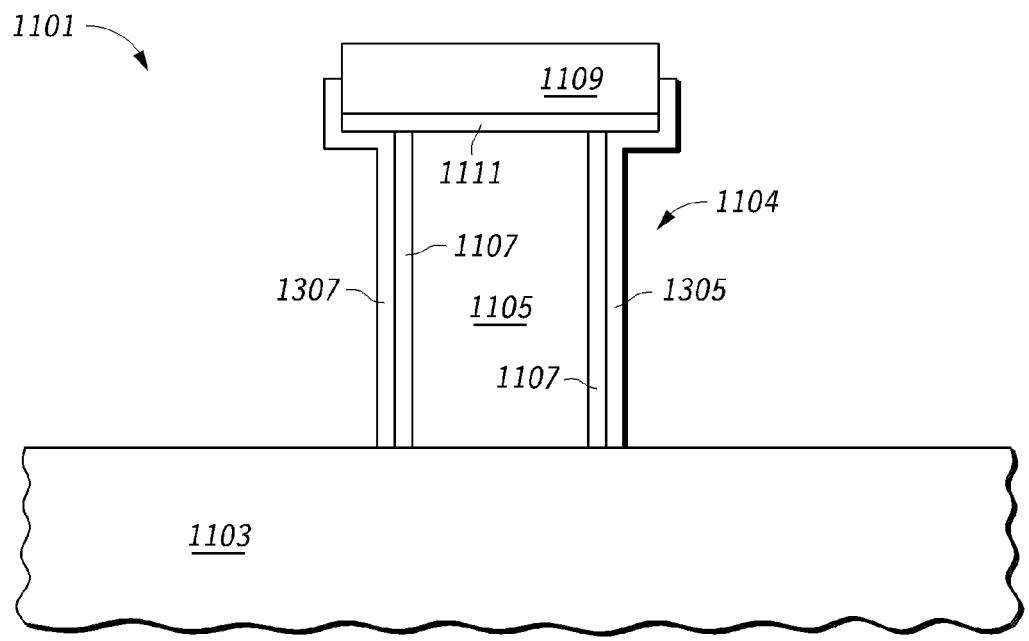
FIG. 13 is a partial cross sectional view of another embodiment of a semiconductor wafer during another stage in the manufacture of a semiconductor device according to an embodiment of the present invention.

FIG. 13 shows a partial cross sectional view of the wafer 1101 after the layer 1203 has been etched to remove the portion of the layer 1203 located over the nitride portion 1109 and located on the insulating layer 1103 to form isolated charge storages structures 1307 and 1305 located on the opposite sidewalls of structure 1104. In one embodiment, the layer 1203 is etched with an anisotropic dry etch to form storage structures 1307 and 1305. In some embodiments, where the charge storage material is made of a high resistivity material such that there would be little to no leakage current, the layer 1203 is not etched. In such embodiments, the charge storage structures having charge storage locations would be part of a contiguous layer 1203.

Figure 14:
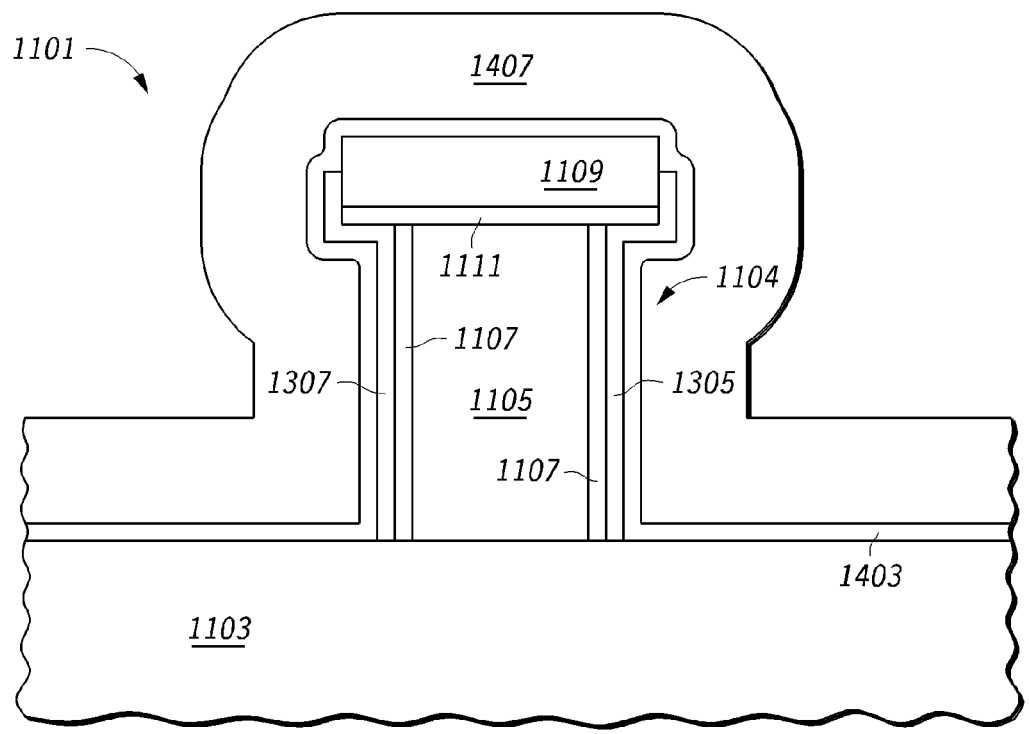
FIG. 14 is a partial cross sectional view of another embodiment of a semiconductor wafer during another stage in the manufacture of a semiconductor device according to an embodiment of the present invention.

FIG. 14 shows a partial cross sectional view of the wafer 1101 after a conformal layer 1403, which becomes a control dielectric, has been deposited over the wafer 1101 and after a conformal layer 1407 of a gate material has been deposited over layer 1403.

Figure 15:
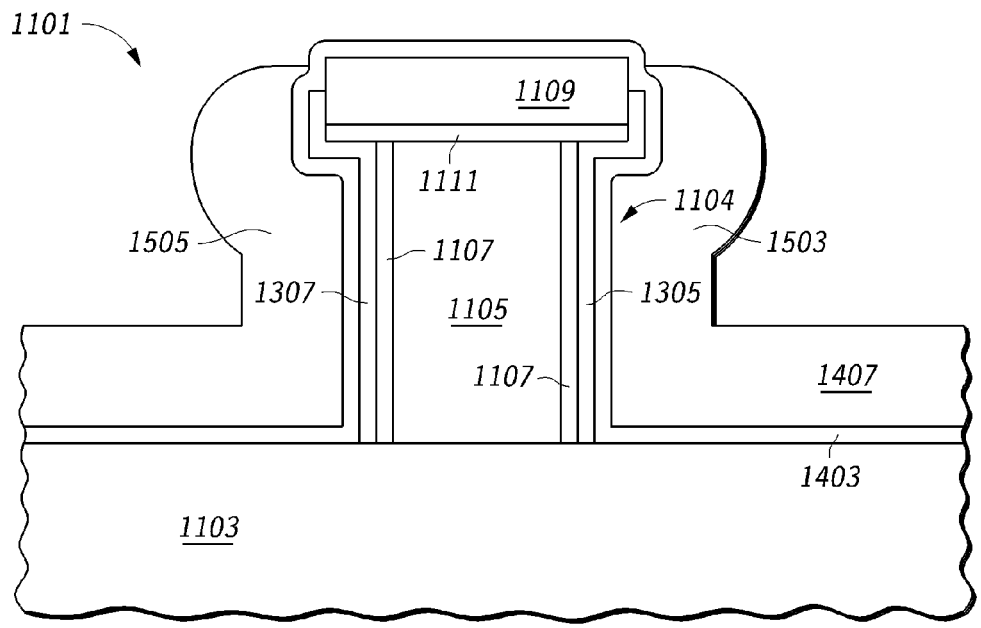
FIG. 15 is a partial cross sectional view of another embodiment of a semiconductor wafer during another stage in the manufacture of a semiconductor device according to an embodiment of the present invention.

After the deposition of the gate material layer 1407, the wafer is further processed to form two gate structures as per a similar process describe above with respect to FIGS. 2-8. For example, a nitride layer (not shown), similar to nitride layer 205 in FIG. 2, is deposited over layer 1407. The nitride layer and the gate material layer 1407 are then patterned to form a gate structure similar to the gate structure 301 shown in FIG. 3. In some embodiments, a portion of the charge storage layer 1203 located on the side of the dielectric layer 1107 and not underneath the gate structure is etched after the gate material layer 1407 has been etched. After the formation of a gate structure, a layer, which may be a planar layer, (similar to layer 403 in FIG. 5) is formed wherein the portion of the nitride layer located above structure 1104 is exposed (See FIG. 5 and the accompanying text.) After the removal of the exposed portion of the nitride layer, the gate material layer 1407 located above structure 1104 is then etched to form gate structures 1505 and 1503, as shown in FIG. 15, in a manner similar to that set forth in FIGS. 6-8 and the accompanying text. FIG. 15 shows a partial side view of the wafer 1101 after the formation of gate structures 1505 and 1503.

Figure 16:
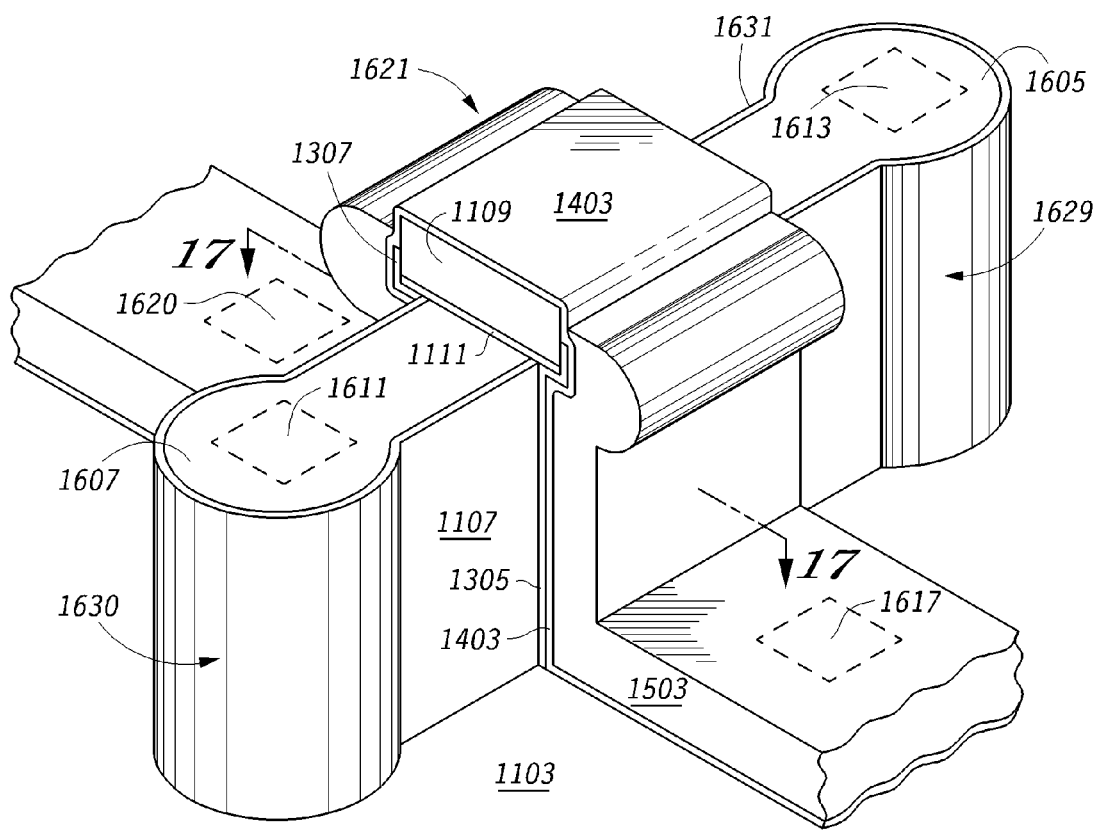
FIG. 16 is a partial view of another embodiment of a semiconductor wafer during another stage in the manufacture of a semiconductor device according to an embodiment of the present invention.

FIG. 16 is a partial view of the transistor structure shown in FIG. 15. Regions 1607 and 1605 serve as current terminal regions with 1611 and 1613 serving as current terminal contacts (e.g. as source/drain contacts for FETs) for those regions. Also, regions 1620 and 1617 serve as gate contacts for gate structures, 1505 and 1503 respectively.

In some embodiments, the gate structures 1503 and 1505 are doped. The material of these gate structures is doped, in one embodiment, prior to the deposition of the nitride layer over the layer of gate material. In some embodiments, the current terminal regions 1607 and 1605 are doped after the formation of gate structures 1505 and 1503 to provide a conductivity type that is different from the conductivity type of the channel region of semiconductor structure portion 1105.

In later processing stages, silicide layers, spacers, gate vias, and current terminal vias and are formed over transistor structure 1621 by conventional semiconductor techniques. A low K dielectric material may be deposited over the resultant transistor structure 1621. Other conventional processing stages not shown or described herein may be performed on wafer 1101 to form other conventional structures (such as e.g. interconnects and passivation layers) of an integrated circuit.

The resultant transistor structure 1621 shown in FIG. 16 can be utilized as a non volatile memory cell having four isolated charge storage locations (two each in charge storage structure 1305 and 1307, respectively) that can each store one of bit of data.

Figure 17:
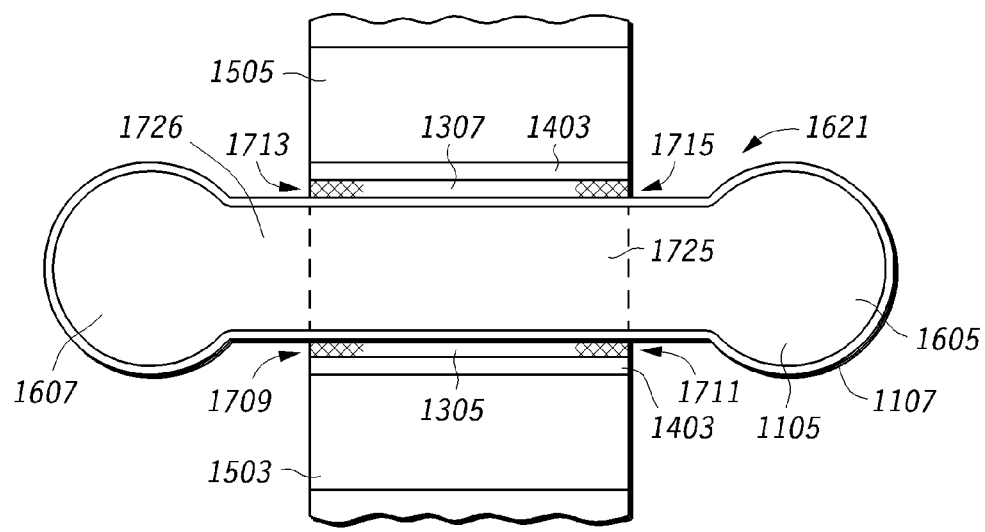
FIG. 17 is a partial top view of another embodiment of a semiconductor device according to an embodiment of the present invention.

FIG. 17 is a partial cutaway top view of semiconductor device structure 1621 shown in FIG. 16. The charge storage structure 1305 includes two charge storage locations 1709 and 1711, and the charge structure 1307 includes two charge storage locations 1713 and 1715. These four charge storage locations may be programmed, read, and or erased by applying voltages to current terminal regions 1605 and 1607 and gate structures 1503 and 1505.

In one embodiment, the semiconductor device structure 1621 functions as two functional MOSFET transistors that share source/drain regions and each have two charge storage locations. The gate structure 1503 serves as the gate for one of the functional transistors, and the gate structure 1505 serves as the gate of the other functional transistors. The charge storage locations 1709 and 1711 serve as charge storage locations for the functional transistor having the gate structure 1503 as its gate, the charge storage locations 1713 and 1715 serve as charge storage locations for the functional transistor having gate structure 1505 as its gate.

In the embodiment shown, in FIG. 17, the semiconductor structure portion 1105 includes a channel region 1725, which is approximately the area delineated by the dashed lines, located between the current terminal regions 1605 and 1607. The channel region 1725 is doped to provide a first conductivity type and current terminal regions 1605 and 1607 are doped to provide a second conductivity type.

During the operation of the transistor structure 1621, when a voltage that exceeds a voltage threshold of the functional transistor associated with the gate structure 1503 is applied to gate structure 1503, an inversion region forms along the sidewall of the channel region 1725 adjacent gate structure 1503. When a voltage that exceeds a voltage threshold of the functional transistor associated with gate structure 1505 is applied to the gate structure 1505, an inversion layer forms along the sidewall of the channel region 1725 adjacent to the gate structure 1505. In some embodiments where the semiconductor structure portion 1105 is relatively thin between the gate structures 1503 and 1505, the regions where the inversion layers occur may overlap.

In constructing a NOR memory array from the semiconductor device structure 1621, the gate structures (e.g. 1505 and 1503) of each cell are coupled to a word line. For example, gate structure 1505 is couple to word line WL1 and gate structure 1503 is coupled to word line WL2. Each current terminal region of a memory cell is coupled to a bitline. For example, terminal contact 1611 of terminal region is coupled to bitline BL1 and current terminal contact 1613 is coupled to bitline BL2.

Figure 18:
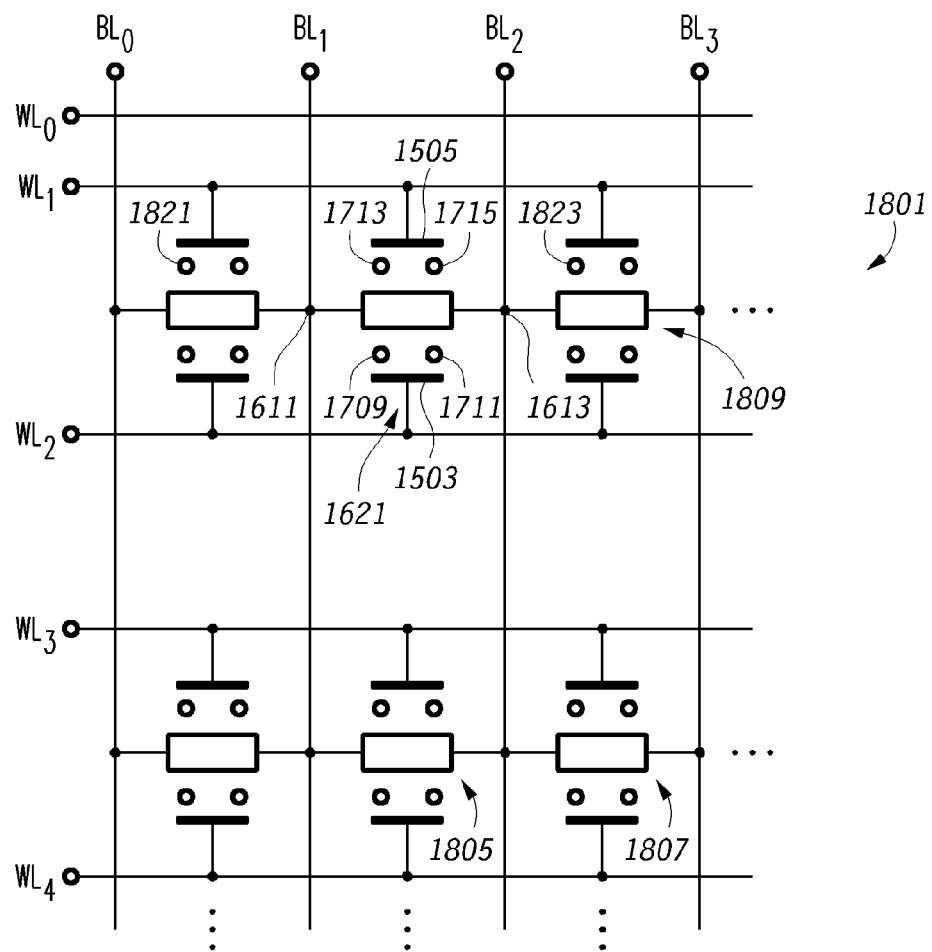
FIG. 18 is a schematic of one embodiment of a memory array according to the present invention.

As shown in FIG. 18, the bitlines (BL0, BL1, BL2, and BL3) and the word lines (WL0, WL1, WL2, WL3, and WL4) of array 1801 are coupled to conventional memory array control circuitry (not shown) for controlling the voltages of the lines. The memory cells are arranged in array 1801 in rows and columns. In the embodiment shown, cells 1809 and the cell of semiconductor device structure 1621 are in the same row, and cells, 1809 and 1807 are in the same column.

Although not shown, all of the cells (1621, 1809, 1805, 1807) in the memory array are within the same well, which may be doped p-type or n-type. Furthermore, a well contact is formed. The well contact is similar to regions 1620 of FIG. 6 and except the well contact is not coupled to the gate structures and instead is contacted to the well. In one embodiment, the well contact is formed by etching a trench and forming a conductive material within the trench that is subsequently planarized (e.g., by performing chemical mechanical polishing.) As will be better understood after further explanation, the well contact is used to apply a first base voltage to the well.

FIG. 19 sets forth voltages applied to the bitlines and word lines shown in FIG. 18 for programming, erasing, and reading storage location 1711 for a p-type doped well. One embodiment of programming the storage location 1711 will be described. An operating voltage is applied to WL2 (the selected word line). The operating voltage is a first gate voltage (VG1), which in one embodiment is approximately 1 to 7V. A shielding voltage is applied to WL3 (the closest adjacent facing word line, which is unselected). In one embodiment, the shielding voltage is approximately equal to the first base voltage (VB1). In one embodiment, the first base voltage may be between approximately 0 and −5V. The closest adjacent facing word line is the closest word line to the selected word line that is separated from the selected word line by an isolation region but not a gate electrode or transistor body. WL1 (the closet adjacent non-facing word line, which is unselected) has an operating voltage applied, is floating, is grounded, or is at the first base voltage. WL1 is non-facing because it is separated from the selected WL2 by a transistor body that disrupts capacitive coupling between WL1 and WL2. If an operating voltage is applied to the WL1 to aid in proper access to storage location 1711, the voltage may be a second operating gate voltage (VG2), which in one embodiment is approximately 0 to −7V. WL0 (a non-adjacent facing word line, which is unselected) is a non-adjacent facing word line because it is not adjacent to the selected wordline (WL2), but is facing the WL1, which may create coupling problems. WL0 faces WL1 because WL0 is separated from WL1 by an isolation region without a transistor body between them. Therefore, if WL1 is not grounded or set to the body bias VB1, then WL0 is biased to a second shielding voltage, which in this embodiment would be the similar to WL3. However, if WL1 is grounded or set to the body bias VB1, then the WL0 may be floated. All other word lines that are far enough from the selected word line or the adjacent non-facing word line so that coupling is not a problem (e.g., WL4) can be floated or grounded to minimize the capacitance that must be driven by wordline power supplies to the array. During this embodiment of programming, the selected bit line (BL2) is coupled to the drain and has a first drain voltage (VD1) applied to it. In one embodiment, the VD1 is approximately 3 to 5V. The other bit line that is coupled to the source (BL1) is at ground. All other bit lines that are unselected (e.g., B0 and B3) are either floating or the first base voltage is applied. The well may be at the first base voltage (VB1).

Because a negative program voltage can be applied to the opposing gate of a charge storage location being programmed, the voltage applied to the gate associated with the cell being programmed may be reduced. Because this embodiment allows for a reduction in the program voltage, lower programming voltages may be utilized. In some embodiments, reducing the programming voltage may allow for a reduction in the area required for circuitry to provide the program voltage.

In one embodiment, a bulk erase is performed on the array 1801 by splitting the total erase voltage between the well and the control gate of the transistor. In one embodiment, all the bit lines (e.g., BL1, BL2, or BL3) are floating or at a second base voltage (VB2). The second base voltage is also applied to the well. In one embodiment, the second base voltage is approximately 0 to 9V. A third gate voltage (VG3) is applied to all the word lines (WL0, WL1, WL2, WL3, and WL4) so that all storage locations are erased. In one embodiment, the third gate voltage is approximately 0 to −9V.

In one embodiment, an erase of a row or group of adjacent rows is performed. In one embodiment, a row erase that erases all storage locations on a row containing locations 1611, 1709, 1711, 1613 will be described. An operating voltage is applied to WL2 (the selected word line). The operating voltage is the third gate voltage (VG3) and as previously described the third gate voltage may be approximately 0 to −9V. A shielding voltage is applied to WL3 (the closest adjacent facing word line, which is unselected). In one embodiment, as previously described, the shielding voltage is approximately equal to the second base voltage. In one embodiment, the second base voltage is between approximately 0 and 9V. All other word lines are floating. For example, WL1 (the closet adjacent non-facing word line, which is unselected), WL0 (non-adjacent facing word), and WL4 are floating. During this embodiment of row erasing, all of the bit lines (e.g., BL0, BL1, BL2, and BL3) are either floating or have the second base voltage applied, which as previously described in one embodiment is approximately 0 to 9V. The well may also be at the second base voltage.

In one embodiment where multiple adjacent rows are erased (e.g., soft sectoring), a shielding voltage is applied, which my be approximately equal to the second base voltage, when the boundary of the rows being erased has adjacent facing rows with the capacitive coupling problem. In one embodiment, WL1 and WL2 are the selected wordlines used to erase all charge storage locations associated with these circuit nodes. In this case there are two adjacent facing gates WL0 and WL3 that have the shielding voltage applied. All other unselected wordlines may be floated.

In one embodiment, WL1, WL2 and WL3 are the selected wordlines used to erase all charge storage locations associated with these circuit nodes. In this case there is only one adjacent facing gate WL0, to which the shielding voltage is applied. The shielding voltage may not be applied to the adjacent non-facing gate WL4 because a transistor body (e.g. 1805, 1807) exists between WL3 and WL4. The transistor body already provides a shielding voltage equal to the second base voltage applied to the well. WL4 can thus be floated like all other unselected wordlines.

In one embodiment, the storage location 1711 is read. One embodiment of reading the storage location 1711 will be described. An operating voltage is applied to WL2 (the selected word line). The operating voltage is a fourth gate voltage (VG4), which in one embodiment is approximately 1 to 4V. A shielding voltage is applied in WL3 (the closest adjacent facing word line, which is unselected). In one embodiment, the shielding voltage is approximately equal to the first base voltage, which as previously described may be approximately 1 to −5V. WL1 (the closet adjacent non-facing word line, which is unselected) has an operating voltage applied, is floating, is grounded, or is at the second base voltage. If an operating voltage is applied to the WL1 to aid in reading charge storage location 1711, the voltage may be a fifth gate voltage (VG5), which in one embodiment is approximately 0 to −4V. If WL1 is driven with operating voltage (VG5), undesirable coupling may occur between WL1 and WL0 (a non-adjacent facing word line, which is unselected.) To minimize this coupling between WL0 and WL1, If WL1 is driven to voltage VG5, a second shielding voltage similar to WL3 may be applied to WL0. However, if WL1 is grounded, floating or equal to the second base voltage, then WL1 is considered not driven and the WL0 may be floated. All other unselected word lines that are far enough from the selected word line or non-facing word lines so that coupling is not a problem (e.g., WL4) are floating. During this embodiment of a read operation, the selected bit line (BL2) is coupled to the drain and has a second drain voltage (VD2) applied to it. In one embodiment, the second drain voltage is approximately 0.5V. The other bit line that is coupled to the source (BL1) is at ground. All other bit lines that are unselected (e.g., B0 and B3) are either floating or the first base voltage is applied (VB1). The first base voltage (VB1) may be applied to the well.

FIG. 20 sets forth the voltages applied to the bitlines and word lines shown in FIG. 18 for programming, erasing, and reading storage location 1713 for a p-type doped well. One embodiment of programming the storage location 1713 will be described. The same names (e.g., first gate voltage or VG1) indicate that the same voltages as previously described may be used, in some embodiments. An operating voltage is applied to WL1 (the selected word line). The operating voltage is the first gate voltage (VG1). A shielding voltage is applied to WL0 (the closest adjacent facing word line, which is unselected). In one embodiment, the shielding voltage is approximately equal to the first base voltage (VB1). WL2 (the closet adjacent non-facing word line, which is unselected) has a voltage applied, is floating, or is grounded, or is at the first base voltage. WL2 is non-facing because it is separated from the selected WL1 by a transistor body that disrupts capacitive coupling between WL1 and WL2. If a voltage is applied to the WL2, the voltage may be a second operating gate voltage (VG2) to aid proper access to storage location 1713. WL3 (a non-adjacent facing word line, which is unselected) is a non-adjacent facing word line because it is not adjacent to the selected wordline (WL1), but is facing the WL2, which may create coupling problems if there is an operating voltage (VG2) applied to WL2. Therefore, if WL2 is not grounded or set to the body bias VB1, then WL3 is biased to a second shielding voltage, which in this embodiment would be the similar to WL0. WL3 faces WL2 because WL3 is separated from WL2 by an isolation region without a transistor body between them. However, if WL2 is grounded or set to the body bias VB1, then the WL3 may float. All other word lines that are far enough from the selected word line or the adjacent non-facing word line so that coupling is not a problem (e.g., WL4) and thus can be floated or grounded to minimize the capacitance that must be driven by wordline power supplies to the array. During this embodiment of programming, the selected bit line (BL1) is coupled to the drain and has the first drain voltage (VD1) applied to it. The other bit line that is coupled to the source (BL2) is at ground. All other bit lines that are unselected (e.g., B0 and B3) are either floating or the first base voltage is applied. The first base voltage (VB1) may be applied to the well.

In one embodiment, a bulk erase is performed on the array 1801 by splitting the total erase voltage between the well and the control gate of the transistor. In one embodiment, all the bit lines (e.g., BL1, BL2, or BL3) are floating or at the second base voltage (VB2). The second base voltage is also applied to the well. The third gate voltage (VG3) is applied to all the word lines (WL0, WL1, WL2, WL3, and WL4) because all storage locations are being erased.

In one embodiment, an erase of a row or group of adjacent rows (e.g., soft sectoring) is performed. In one embodiment, a row erase that all storage locations on a row containing locations 1821, 1713, 1715, 1823 will be described. An operating voltage is applied to WL1 (the selected word line). The operating voltage is the third gate voltage (VG3). A shielding voltage is applied to WL0 (the closest adjacent facing word line, which is unselected). In one embodiment, the shielding voltage is approximately equal to the second base voltage. All other word lines are floating. For example, WL1 (the closet adjacent non-facing word line, which is unselected), WL0 (non-adjacent facing word), and WL4 are floating. During this embodiment of row erasing, all of the bit lines (e.g., BL0, BL1, BL2, and BL3) are either floating or have the second base voltage applied. The second base voltage may be applied to the well.

In one embodiment, the storage location 1713 is read. One embodiment of reading the storage location 1713 will be described. An operating voltage is applied to WL1 (the selected word line). The operating voltage is the fourth gate voltage (VG4). A shielding voltage is applied in WL0 (the closest adjacent facing word line, which is unselected). In one embodiment, the shielding voltage is approximately equal to the first base voltage. WL2 (the closet adjacent non-facing word line, which is unselected) has an operating voltage applied, is floating, is grounded, or is at the second base voltage. If an operating voltage is applied to the WL2 to aid in reading charge storage location 1713, the voltage may be a fifth gate voltage (VG5), which in one embodiment is approximately 0 to −4V. If WL2 is driven with operating voltage (VG5), undesirable coupling might occur between WL2 and WL3 (a non-adjacent facing word line, which is unselected.) To minimize this coupling between WL3 and WL2 if WL2 is driven to voltage VG5, a second shielding voltage similar to WL0 may be applied to WL3. However, if WL2 is grounded, floating or equal to the second base voltage, then WL2 is considered not driven and the WL3 may be floated. All other unselected word lines that are far enough from the selected word line or is a non-facing word line so that coupling is not a problem (e.g., WL4) are floating. During this embodiment of a read operation, the selected bit line (BL1) is coupled to the drain and has the second drain voltage (VD2) applied to it. The other bit line that is coupled to the source (BL2) is at ground. All other bit lines that are unselected (e.g., B0 and B3) are either floating or the first base voltage is applied. The first base voltage (VB1) may be applied to the well.

Based on the above teachings of programming, erase (bulk or row), and read of the storage locations 1711 and 1713 any other storage location (e.g., 1709 and 1715) can be determined.

The above operating conditions allow for minimization of coupling between adjacent facing lines. A bias is applied to the unselected adjacent facing word line to ensure that a small or no electric field is applied across the stack of the unselected storage locations. A wordline is facing if it is adjacent to a wordline driven to an operating voltage and the two word lines are separated by an insulator region that does not include a transistor body. One way to achieve this is to bias the closest adjacent facing word line to the same potential as the body voltage for that operation. If the source or drain voltage are significantly different from the body potential, which is possible during reverse biasing of source/drain junctions, then the closest adjacent facing word line may be biased to a weighted average of the source, drain, and body potentials to minimize the field across any portion of the memory device. The weighted average could be tailored to improve reliability of the memory array. Furthermore, a row erase is possible using Fowler-Nordheim tunneling by setting the closest adjacent facing word line bias to match the body potential. If this was not done, the closest adjacent facing word line may be undesirably erased.

The above operating conditions are believed to be most useful for a NOR non-planar memory array (e.g., an array made of up finFETs as described with respect to FIGS. 1-17). However, the operating conditions can be beneficial to any memory structure, such as memory arrays of any NOR planar devices.

Another advantage that may occur from using a transistor with adjacent gate structures on to opposing sidewalls of the transistor body in a memory array is that the opposite gate of a charge storage location can provide a transistor such as e.g. a FinFET with a voltage control circuit that effectively acts like as a well voltage control circuit for a planar CMOS transistor. For this reason, we envision the possibility that two gate operating voltages may be used to aid in the access of a charge storage location as described in one embodiment above. However, unlike the well voltage control circuit for planar CMOS transistors, the voltage of the opposing gate can be controlled independently of gates in other rows of the array. This may allow for the use of more advanced program and erase techniques for an array than would be possible with other types of charge storage transistors.

Another possible advantage applies to one embodiment of a charge storage memory array that is typically operated with a non-zero base voltage applied to the well. To establish a near zero electric field condition across the unselected wordlines, which increases reliability, one must either float those wordlines or apply the base potential to the unselected wordlines. The latter option is undesirable due to the requirement for a stronger power supply to drive the extra capacitance associated with the coupling of unselected wordlines with other conducting structures. Thus faster access or lower cost may be achieved if many of the unselected wordlines can be floated.

In the foregoing specification, the invention has been described with reference to specific embodiments. However, one of ordinary skill in the art appreciates that various modifications and changes can be made without departing from the scope of the present invention as set forth in the claims below. For example, other voltages then those described can be used. In addition, the programming, erase, and read conditions were explained for a p-type doped well. A skilled artisan recognizes that the well may be doped n-type and in this embodiment, the polarity of the voltage applied to the gate and the voltage applied to the common base may be opposite that for the p-type doped well (e.g., the voltage applied to the gate is negative for n-type doped wells.) Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more. The term "coupled", as used herein, is defined as connected, although not necessarily directly, and not necessarily mechanically.

What is claimed is:

1. A method for erasing a memory device, the method comprising:

selecting a cell comprising an array of word lines;

selecting a word line within said array, wherein the array consists of said selected word line, a closest adjacent facing word line of said selected word line, and unselected word lines;

applying an operating voltage to said selected word line;

applying a shielding voltage to said closest adjacent facing word line of said selected word line; and floating the unselected world lines of said array while applying the operating voltage to said selected word line.

2. The method of claim 1, wherein said selected word line has a closest, adjacent non-facing word that has an applied voltage.

3. The method of claim 2, wherein said closest, adjacent non-facing word line has an applied voltage between approximately 0 volts and −7 volts.

4. The method of claim 1, wherein said operating voltage is between approximately 1 volt and 7 volts.

5. The method of claim 1, wherein said method for operating said memory device is a method for operating a non-volatile charge storage device.

6. The method of claim 1, wherein said method for operating said memory device is a method for operating a nanocrystalline FinFET flash device.

7. A method for erasing a memory device, the method comprising:

selecting a cell comprising an array of word lines;

selecting a word line within said array;

applying a first operating voltage to said selected word line;

applying a first shielding voltage to the closest adjacent facing word line of said selected word line;

applying a second operating voltage to an adjacent word line of said selected word line;

applying a second shielding voltage to the closest adjacent facing word line of said adjacent word line; and floating the remainder of the unselected word lines of the array while applying the first operating voltage to said selected word line.

8. The method of claim 7, wherein said first shielding voltage is approximately equal to said second shielding voltage.

9. The method of claim 8, wherein said first shielding voltage is between approximately 0 volts and −5 volts.

10. The method of claim 7, wherein said first operating voltage is between approximately 1 volt and 7 volts.

11. The method of claim 7, wherein said selected word line has a closest, adjacent non-facing word line.

12. The method of claim 11, wherein said closest, adjacent non-facing word line has an applied voltage between approximately 0 volts and −7 volts.

13. The method of claim 7, wherein said method for operating said memory device is a method for operating a non-volatile charge storage device.

14. The method of claim 7, wherein said method for operating said memory device is a method for operating a nanocrystalline FinFET flash device.

15. The method of claim 1, wherein the array is a NOR array.

* * * * *